(12) United States Patent
Yasuo et al.

(10) Patent No.: US 8,901,434 B2
(45) Date of Patent: Dec. 2, 2014

(54) BOARD UNIT AND METHOD OF FABRICATING THE SAME

(75) Inventors: Akihiro Yasuo, Yokohama (JP); Koji Kuroda, Fuji (JP)

(73) Assignee: Fujitsu Limited, Kawasaki (JP)

( * ) Notice: Subject to any disclaimer, the term of this patent is extended or adjusted under 35 U.S.C. 154(b) by 150 days.

(21) Appl. No.: 13/422,328

(22) Filed: Mar. 16, 2012

(65) Prior Publication Data

US 2012/0236523 A1    Sep. 20, 2012

(30) Foreign Application Priority Data

Mar. 18, 2011    (JP) ................................. 2011-061322

(51) Int. Cl.
| | |
|---|---|
| *H05K 1/11* | (2006.01) |
| *H05K 1/16* | (2006.01) |
| *H05K 1/00* | (2006.01) |
| *H01R 13/73* | (2006.01) |
| *H05K 3/30* | (2006.01) |
| *H05K 1/02* | (2006.01) |
| *H05K 3/42* | (2006.01) |

(52) U.S. Cl.
CPC .............. *H05K 3/308* (2013.01); *H05K 1/0243* (2013.01); *H05K 3/429* (2013.01); *H05K 2201/10325* (2013.01); *H05K 2201/1059* (2013.01)
USPC ........... 174/262; 174/263; 174/264; 174/265; 174/266; 174/260; 439/78; 439/571; 439/572

(58) Field of Classification Search
USPC ................. 174/260, 262–266; 361/792–795; 439/65, 78, 571, 572
See application file for complete search history.

(56) References Cited

U.S. PATENT DOCUMENTS

| | | | | |
|---|---|---|---|---|
| 4,550,493 | A | * | 11/1985 | Darrow et al. .................. 29/739 |
| 4,686,607 | A | * | 8/1987 | Johnson ........................ 361/788 |
| 4,787,853 | A | * | 11/1988 | Igarashi .......................... 439/55 |
| 4,892,492 | A | * | 1/1990 | Mueller ........................ 439/828 |
| 5,067,232 | A | * | 11/1991 | Seidel et al. .................... 29/837 |
| 5,744,758 | A | * | 4/1998 | Takenouchi et al. .......... 174/255 |
| 6,663,442 | B1 | | 12/2003 | Helster et al. |
| 6,909,056 | B2 | * | 6/2005 | Vinther ........................ 174/260 |
| 7,326,856 | B2 | | 2/2008 | Takada |

(Continued)

FOREIGN PATENT DOCUMENTS

| | | |
|---|---|---|
| JP | 61-157368 U | 9/1986 |
| JP | 03-044995 | 2/1991 |

(Continued)

OTHER PUBLICATIONS

Japanese Notification of Reasons for Refusal dated Jul. 22, 2014 in Japanese Patent Application No. 2011-061322.

*Primary Examiner* — Timothy Thompson
*Assistant Examiner* — Sherman Ng
(74) *Attorney, Agent, or Firm* — Staas & Halsey LLP

(57) ABSTRACT

A board unit includes a board that has a through hole penetrating the board from a first side of the board to a second side of the board and having a conductive inner wall surface a first electronic component that has a first connection pin to be press-fitted in the through hole from the first side of the board, and a conductive member that is disposed in the through hole to connect the inner wall surface of the through hole to the first connection pin.

8 Claims, 15 Drawing Sheets

(56) References Cited

U.S. PATENT DOCUMENTS

| | | | |
|---|---|---|---|
| 2002/0182903 A1 | 12/2002 | Ishida et al. | |
| 2004/0101666 A1* | 5/2004 | Tsubosaki et al. | 428/209 |
| 2007/0107931 A1* | 5/2007 | Takenaka et al. | 174/256 |
| 2009/0294169 A1* | 12/2009 | Tsubamoto et al. | 174/266 |
| 2010/0041251 A1* | 2/2010 | Nakayama | 439/65 |
| 2010/0221960 A1* | 9/2010 | Chung | 439/733.1 |

FOREIGN PATENT DOCUMENTS

| | | |
|---|---|---|
| JP | 2751556 | 5/1998 |
| JP | 10-275966 | 10/1998 |
| JP | 11-195678 | 7/1999 |
| JP | 2002-184943 | 6/2002 |
| JP | 2005-183649 | 7/2005 |
| JP | 2009-302289 | 12/2009 |

* cited by examiner

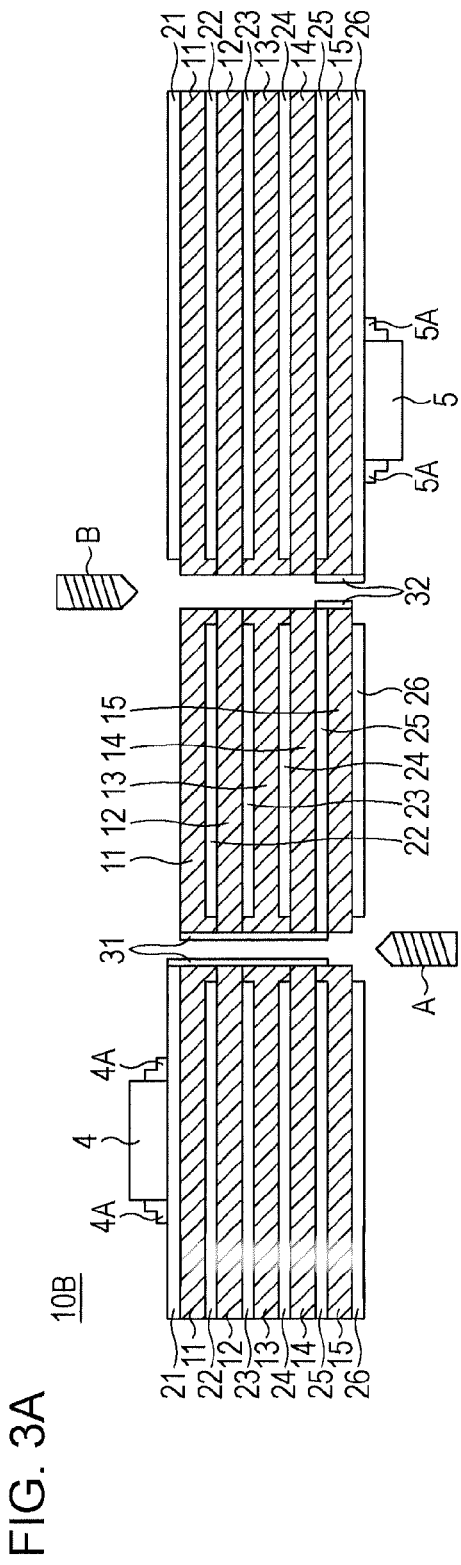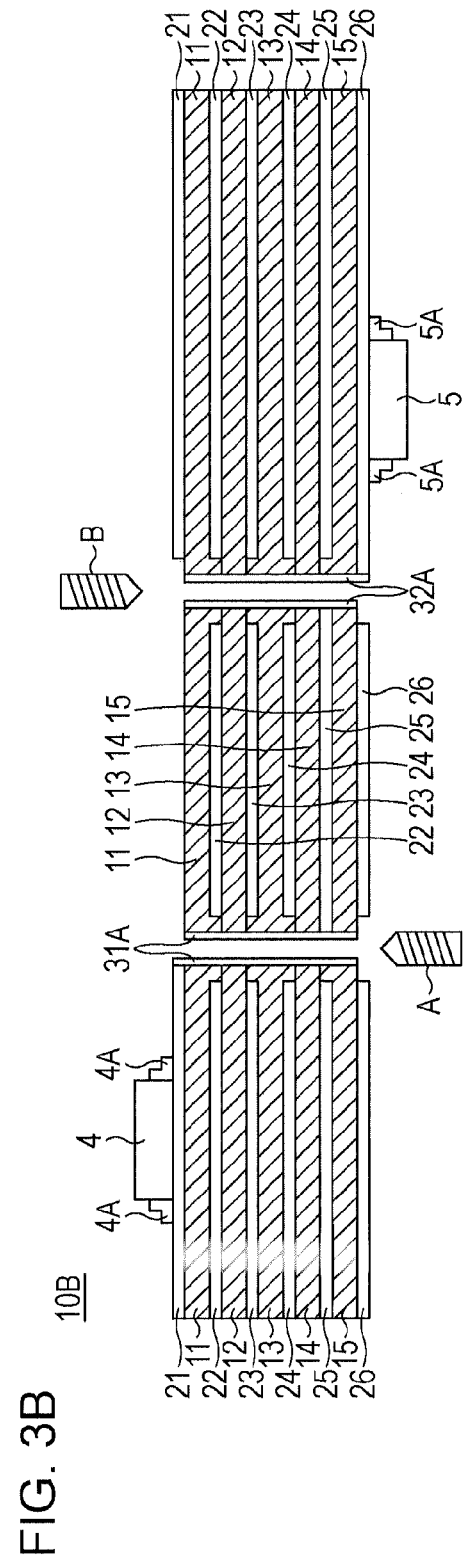

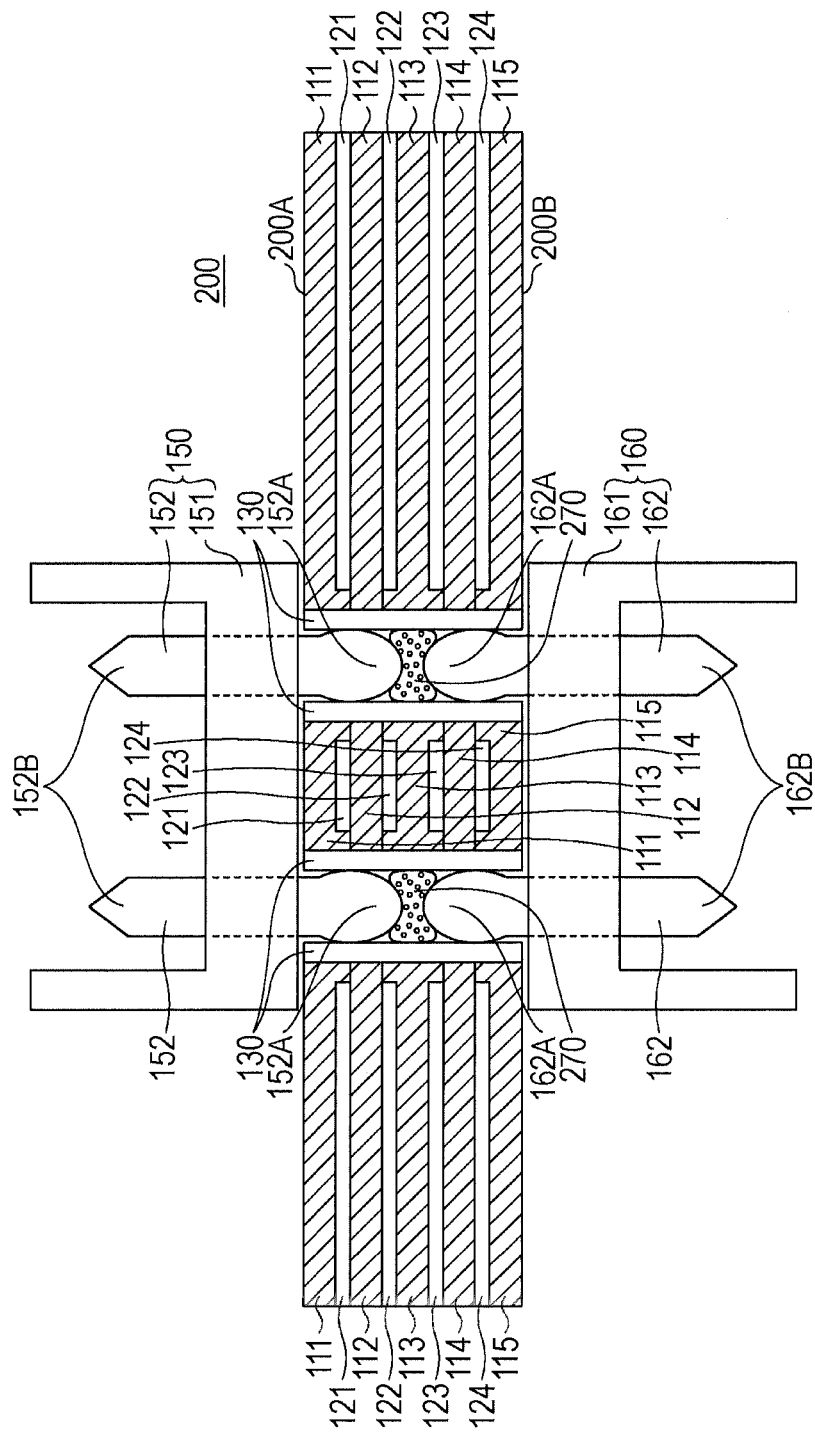

BOARD UNIT AND METHOD OF FABRICATING THE SAME

CROSS-REFERENCE TO RELATED APPLICATION

This application is based upon and claims the benefit of priority of the prior Japanese Patent Application No. 2011-61322, filed on Mar. 18, 2011, the entire contents of which are incorporated herein by reference.

FIELD

The embodiments discussed herein are related to a board unit, and a method of fabricating the board unit.

BACKGROUND

Japanese Laid-open Patent Publication No. 2005-183649 and U.S. Pat. No. 6,663,442 discuss a multilayer wiring board that has two through holes formed therein side by side and connected together at both end portions or one end portions thereof, thereby removing stub portions of the through holes.

The term "stub" used herein means a branch wire among wires of a printed circuit board or a semiconductor substrate which is neither connected to any terminal (terminated), nor grounded.

According to one method of forming a through hole that connects to an internal layer wire of a printed board, a metal film is formed on the inner wall of a through hole, and is then cut out from the bottom side of the printed board, thereby removing an unnecessary portion to be a stub.

There is a case where pins of a connector or the like are inserted in through holes to mount the connector or the like on a printed circuit board. Because each pin has a tapered tip, some part of the tip portion of the pin does not contact the conductive wall surface of the through hole.

Even if stubs of through holes are reduced by the foregoing scheme of the related art, therefore, stubs are formed at the tip portions of the pins of a connector or the like when the pins are inserted into through holes.

The stubs formed at the tip portions of the pins this way deteriorate the signal transfer characteristic on the board, and particularly, causes significant deterioration of the fast signal transfer characteristic.

SUMMARY

According to an aspect of the invention, an board unit includes a board that has a through hole penetrating the board from a first side of the board to a second side of the board and having a conductive inner wall surface, a first electronic component that has a first connection pin to be press-fitted in the through hole from the first side of the board, and a conductive member that is disposed in the through hole to connect the inner wall surface of the through hole to the first connection pin.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A is a diagram illustrating a printed circuit board;

FIG. 3B is a diagram illustrating a fabrication process for the printed circuit board;

FIG. 10 is a diagram illustrating the cross-sectional structure of a board unit according to a second embodiment;

DESCRIPTION OF EMBODIMENTS

Hereinafter, board units and methods of fabricating the board units according to embodiments are described.

Before discussing the board units and board unit fabricating methods according to the embodiments, board units and board unit fabricating methods according to comparative examples are described referring to FIGS. 1 to 5.

Figure 1:
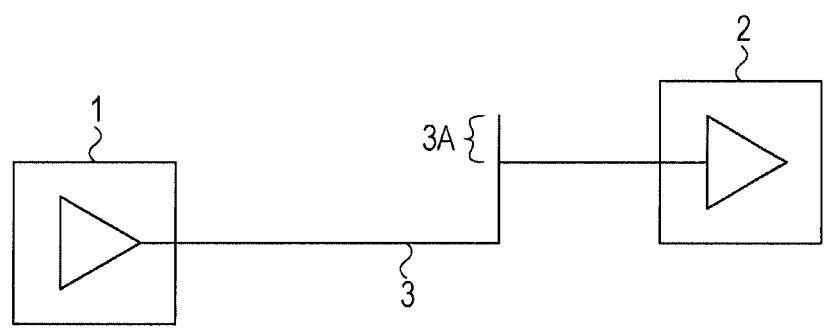
FIG. 1 is a diagram illustrating a stub in a signal transfer path.

FIG. 1 is a diagram illustrating a stub in a signal transfer path. Assume that a portion 3A which branches off from a transfer path 3 and is not terminated exists in the transfer path 3 in case of transferring a signal from a buffer 1 to a buffer 2 through the transfer path 3. This portion 3A is a stub 3A.

The stub 3A causes reflection of a transferred signal, resulting in mismatching of the impedance of the transfer path 3, and serves as an antenna to radiate the transferred signal, generating noise.

The microfabrication of semiconductor processes increases the operational frequency of large scale integrated circuits (LSIs) every year. Accordingly, there is a need for faster access to outside LSIs.

Attempts to improve the transfer speed have been made in the transfer standards of Ethernet®, InfiniBand®, etc., but it is said that transfer using electric signals is limited.

However, it is actually possible to achieve transfer of electric signals in 10-GB Ethernet, and signal transfer in 40-GB Ethernet or 100-GB Ethernet is nearly achieved.

Such fast signal transfer is greatly affected by reflection of signals or generation of noise at a stub.

The influence of a stub is not problematic in slow signal transfer. With regard to fast signals with frequencies of over 10 Gbps in particular, however, a stub with a unit length of mm significantly affects the signal transfer characteristic. When the signal frequency is 20 GHz, for example, a stub with a length of 0.6 mm may cause primary resonance, resulting in radiation loss.

Such a stub may be produced in, for example, a through hole which connects to an inner layer of a printed circuit board. As a multilayer board with reduced stubs to cope with the problem, there is a build-up board which is fabricated by stacking a copper foil, a core layer, a prepreg layer, etc. one after another, and forming interconnection.

Figure 2:
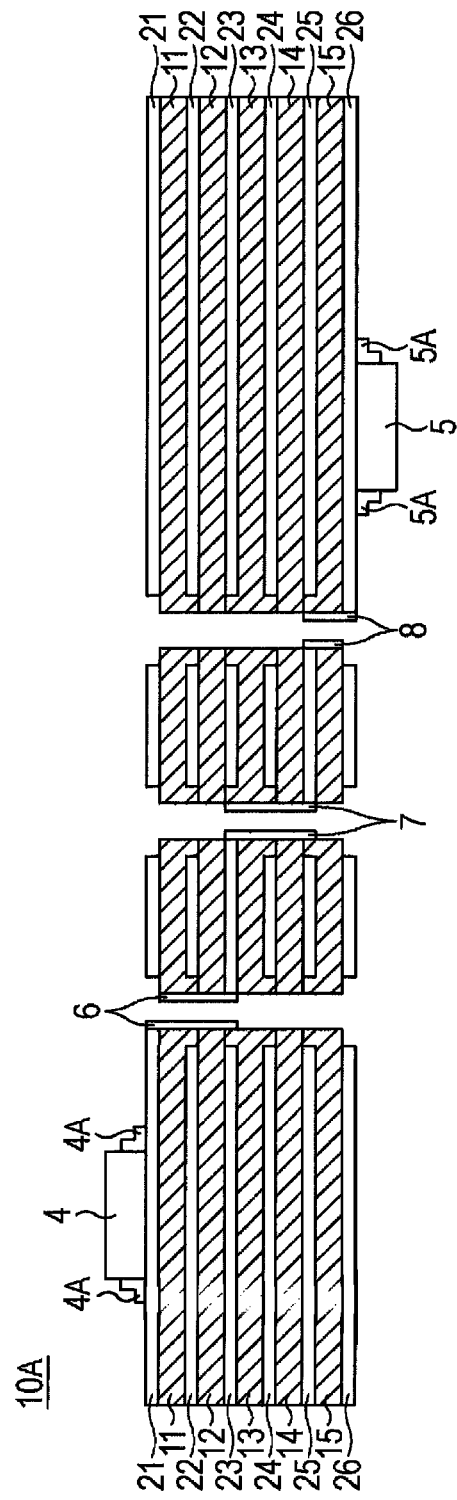
FIG. 2 is a diagram illustrating the cross-sectional structure of a build-up board.

FIG. 2 is a diagram illustrating the cross-sectional structure of a build-up board 10A. The build-up board 10A is fabricated by stacking insulating layers 11, 12, 13, 14, 15 and conductive layers 21, 22, 23, 24, 25, 26 alternately.

The conductive layers 21 and 26 are respectively provided on the top surface and bottom surface of the build-up board 10A, and LSIs 4, 5 are respectively mounted on the conductive layers 21, 26. The LSIs 4, 5 are connected to the conductive layer 21 via connection parts 4A, 5A respectively. The conductive layers 22 to 25 are internal conductive layers held between the insulating layers 11, 12, 13, 14, 15.

A through hole 6 that connects the conductive layer 21 to the conductive layer 23, a through hole 7 that connects the conductive layer 23 to the conductive layer 25, and a through hole 8 that connects the conductive layer 25 to the conductive layer 26 are formed in the stages of sequentially stacking the insulating layers 11 to 15 and the conductive layers 21 to 26 one after another.

When the LSIs 4, 5 are respectively mounted on the conductive layers 21, 26 at the connection parts 4A, 5A after completion of the build-up board 10A, the LSIs 4, 5 are electrically connected to each other with the conductive layer 21, the through hole 6, the conductive layer 23, the through hole 7, the conductive layer 25, the through hole 8, and the conductive layer 26.

Because the through holes 6, 7, 8 of the build-up board 10A hardly have stubs formed therein, the build-up board 10A has a good signal transfer characteristic.

However, the build-up board 10A has an economical problem of being expensive due to the foregoing layer-by-layer lamination.

As a scheme of reducing stubs in through holes, there is a scheme called back drilling.

FIG. 3A is a diagram illustrating a printed circuit board 10B that is fabricated with stubs removed by back drilling, and FIG. 3B is a diagram illustrating the printed circuit board 10B before carrying out back drilling.

As illustrated in FIG. 3A, the printed circuit board 10B includes insulating layers 11, 12, 13, 14, 15, conductive layers 21, 22, 23, 24, 25, 26, and through holes 31, 32. The printed circuit board 10B is fabricated by thermal adhesion of a plurality of insulating layers and a plurality of conductive layers at a time.

In the printed circuit board 10B as illustrated in FIG. 3A, the conductive layer 21 and the conductive layer 25 are connected together via the through hole 31, and the conductive layer 25 and the conductive layer 26 are connected together via the through hole 32.

A method of forming the through holes 31, 32 by back drilling is described below.

First, through holes 31A, 32A are formed from the top surface of the printed circuit board 10B to the bottom surface thereof as illustrated in FIG. 3B.

The through holes 31A, 32A are formed by boring through holes penetrating the printed circuit board 10B from the conductive layer 21 of the printed circuit board 10B to the conductive layer 26 thereof with a drill or the like, and performing plating on the wall surfaces of the through holes. The plating process is carried out by, for example, forming electroless plated layers on the wall surfaces of the through holes first, then forming electrolytic plated layers on the electroless plated layers. Available examples of the electroless plated layers and electrolytic plated layers include a copper plated layer, a gold plated layer, a tin plated layer, or the like.

Next, an unnecessary portion of the through hole 31A is cut out with a drill A from the bottom side in FIG. 3B, and an unnecessary portion of the through hole 32A is cut out with a drill B from the top side in FIG. 3B. Cutting out the unnecessary portions with the drills A, B this way completes the through holes 31, 32 as illustrated in FIG. 3A.

Although the through holes 31, 32 as illustrated in FIG. 3A can be formed with back drilling, it is desirable to cope with positional alignment of the through holes 31, 32 in the depth direction using the drills A, B.

This makes it difficult to completely remove unnecessary portions with back drilling, so that a minute stub may remain in the through hole 31 at a portion lower than the bottom surface of the conductive layer 25 and a minute stub may remain in the through hole 32 at a portion higher than the top surface of the conductive layer 25.

Figure 4:
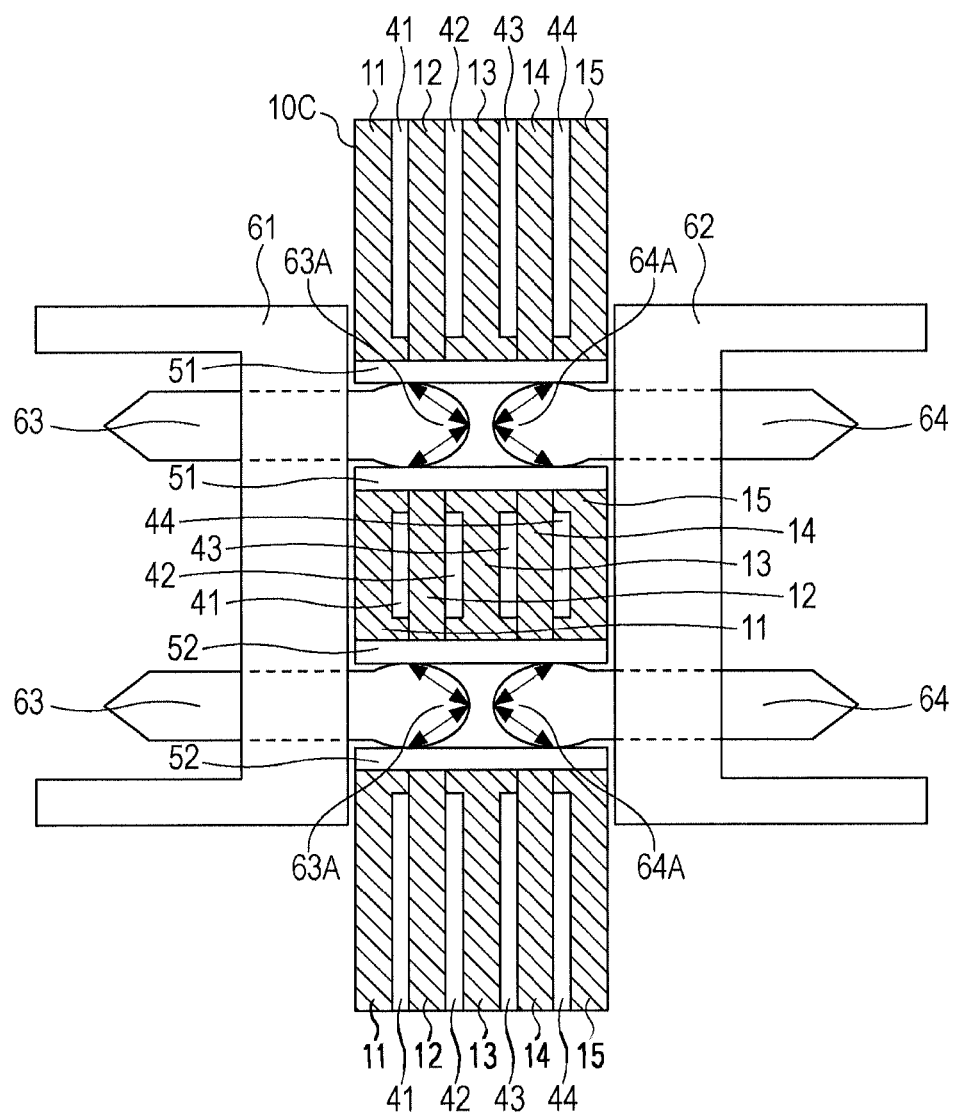
FIG. 4 is a diagram illustrating a board unit according to a first comparative example.

A blade server or a large communication apparatus may use a back-to-back press-fit connector as illustrated in FIG. 4.

FIG. 4 is a diagram illustrating a board unit 10C according to a first comparative example.

The board unit 10C as illustrated in FIG. 4 includes insulating layers 11, 12, 13, 14, 15, conductive layers 41, 42, 43, 44, through holes 51, 52, and press-fit connectors 61, 62. The insulating layers 11, 12, 13, 14, 15, conductive layers 41, 42, 43, 44, and through holes 51, 52 of the board unit 10C form a printed circuit board (board). The laminate of the insulating layers 11, 12, 13, 14, 15, and the conductive layers 41, 42, 43, 44 included in the board unit 10C is fabricated by thermal adhesion of a plurality of insulating layers (11 to 15) and a plurality of conductive layers (41 to 44) at a time.

The conductive layers 41 to 44 of the board unit 10C are all internal conductive layers. The conductive layers 41 to 44 are not connected to the through holes 51, 52, but are formed to avoid the through holes 51, 52 as seen in plan view.

The through holes 51, 52 are formed by boring through holes penetrating the board unit 10C from the insulating layer 11 of the printed circuit board 10C to the insulating layer 15 thereof with a drill or the like, and performing plating on the wall surfaces of the through holes. The plating process is carried out by, for example, forming electroless plated layers on the wall surfaces of the through holes first, then forming electrolytic plated layers on the electroless plated layers. Available examples of the electroless plated layers and electrolytic plated layers include a copper plated layer, a gold plated layer, a tin plated layer, or the like.

The press-fit connectors 61, 62, which are back-to-back press-fit connectors, are mounted on both sides of the board unit 10C, respectively.

Tips 63A, 64A of connection pins 63, 64 of the press-fit connector 61, 62 are respectively press-fitted in the through holes 51, 52 of the board unit 10C. As a result, the connection pins 63, 64 are electrically connected via the through holes 51, 52.

When the back-to-back press-fit connectors 61, 62 are used, an interconnection like a cable is not provided between the connectors (61, 62) and the length of the interconnection between the connection pin 63 and the connection pin 64 can be made shorter.

Because the tips 63A, 64A of the connection pins 63, 64 are tapered, the tips 63A, 64A do not contact the inner wall surfaces of the through holes 51, 52.

Accordingly, portions of the tips 63A, 64A indicated by arrows in FIG. 4 may become stubs to cause impedance mismatching originating from reflection of signals, or generate noise due to radiation of signals from the stubs serving as an antenna. This problem becomes more noticeable when the signal transfer speed becomes higher.

A similar problem occurs on a press-fit connector which is mounted only on one side of the board unit as well as the back-to-back press-fit connectors 61, 62.

Figure 5:
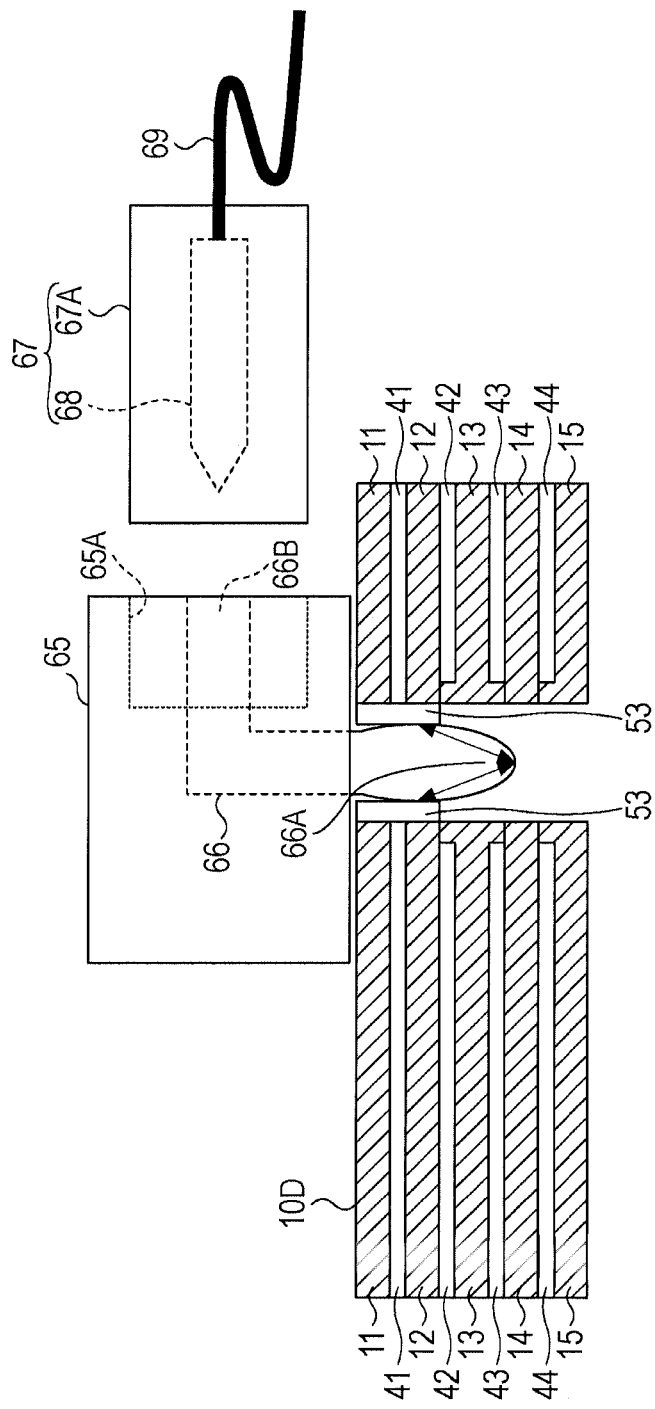
FIG. 5 is a diagram illustrating a board unit according to a second comparative example.

FIG. 5 is a diagram illustrating a board unit 10D according to a second comparative example.

The board unit 10D includes insulating layers 11, 12, 13, 14, 15, conductive layers 41, 42, 43, 44, a through hole 53, and a press-fit connector 65. The insulating layers 11, 12, 13, 14, 15, conductive layers 41, 42, 43, 44, and through hole 53 of the board unit 10D form a printed circuit board (board). The laminate of the insulating layers 11, 12, 13, 14, 15, and the conductive layers 41, 42, 43, 44 included in the board unit 10D is fabricated by thermal adhesion of a plurality of insulating layers (11 to 15) and a plurality of conductive layers (41 to 44) at a time.

The conductive layers 41 to 44 of the board unit 10D are all internal conductive layers. The conductive layer 41 is connected to the through hole 53, and the conductive layers 42 to 44 are not connected to the through hole 53, but are formed to avoid the through hole 53 as seen in plan view.

The through hole 53 is formed by boring a through hole penetrating the board unit 10D from the insulating layer 11 of the board unit 10D to the insulating layer 15 thereof with a drill or the like, and performing plating on the wall surface of the through hole. At this time, the through hole 53 and the conductive layer 41 are connected to each other. The plating process is carried out by, for example, forming an electroless plated layer on the wall surface of the through hole first, then forming an electrolytic plated layer on the electroless plated layer. Available examples of the electroless plated layer and electrolytic plated layer include a copper plated layer, a gold plated layer, a tin plated layer, or the like.

A tip 66A of a connection pin 66 of the press-fit connector 65 is press-fitted in the through hole 53 of the board unit 10D. As a result, the press-fit connector 65 is mounted on one side of the board unit 10D, and the connection pin 66 is electrically connected via the through hole 53.

A female connector portion 66B of the press-fit connector 65 is provided on a recess 65A of the press-fit connector 65. A cable connector 67 is connected to the female connector portion 66B.

The cable connector 67 includes a casing 67A and a male connector portion 68 held inside the casing 67A. The male connector portion 68 of the cable connector 67 is inserted into the female connector portion 66B of the press-fit connector 65. At this time, part of the casing 67A of the cable connector 67 is press-fitted in the recess 65A of the press-fit connector 65. A cable 69 is connected to the male connector portion 68 of the cable connector 67.

Because the tip 66A of the connection pin 66 of the press-fit connector 65 is likewise tapered, the tip 66A does not contact the inner wall surface of the through hole 53.

Accordingly, portions of the tip 66A indicated by arrows in FIG. 5 may become stubs to cause impedance mismatching originating from reflection of signals, or generate noise due to radiation of signals from the stubs serving as an antenna. This problem becomes more noticeable when the signal transfer speed becomes higher.

As apparent from the above, the press-fit connectors 61, 62, and the press-fit connector 65 which are respectively mounted on the board units 10C and 10D according to the first and second comparative examples have a problem that stubs are formed at the tips 63A, 64A, 66A of the connection pins 63, 64, 66.

The following describes board units according to first to fourth embodiments that overcome the foregoing problem.

First Embodiment

Figure 6:
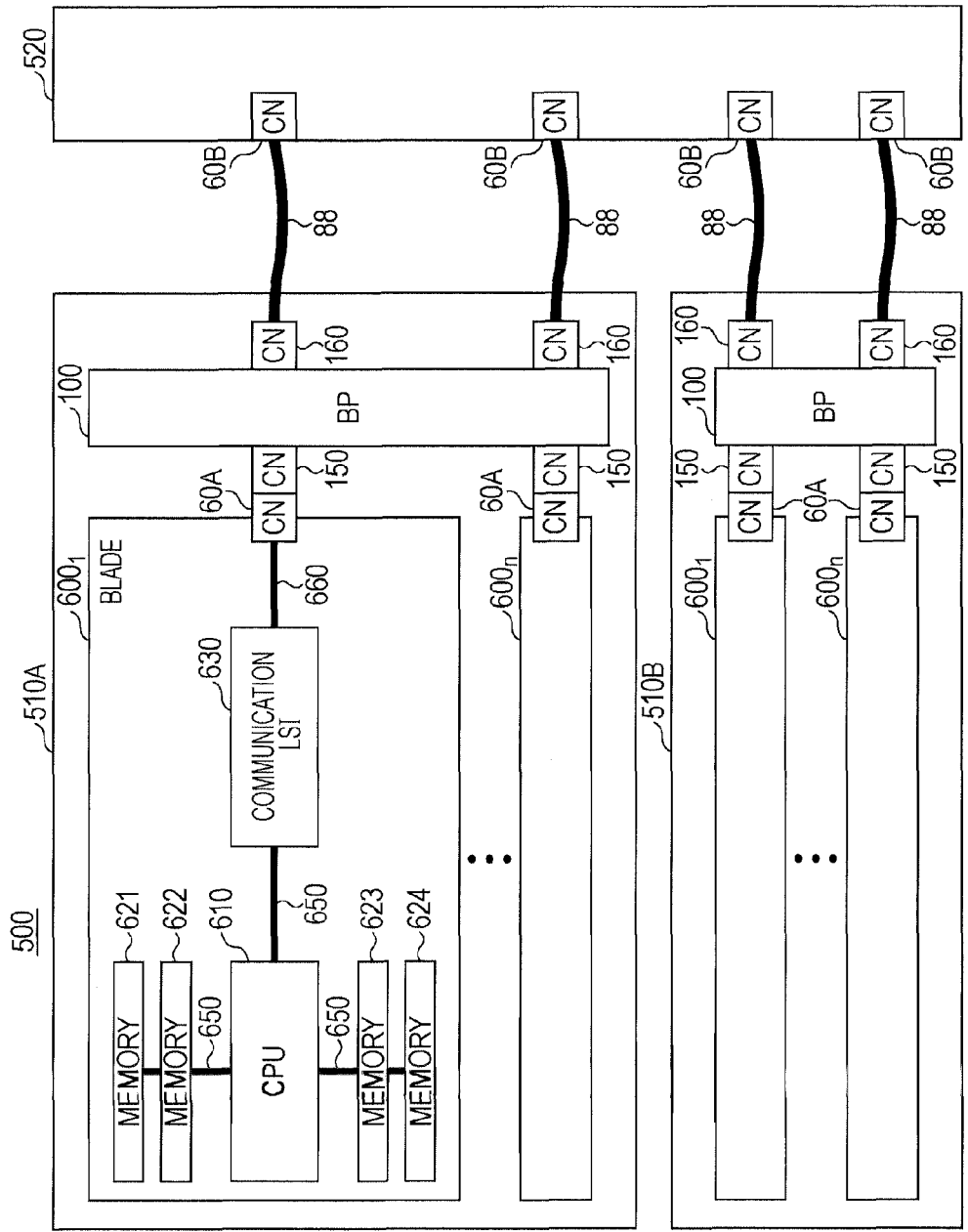
FIG. 6 is a diagram illustrating the block configuration of a server including a board unit according to a first embodiment.

FIG. 6 is a diagram illustrating the block configuration of a server 500 including a board unit 100 according to a first embodiment.

The server 500 is an example of an electronic apparatus including the board unit 100 according to the first embodiment. The server 500 includes a chassis 510A, a chassis 510B, and a switch module 520.

The chassis 510A includes a plurality of blades $600_1$ to $600_n$, and the board unit 100 where n is an integer equal to or greater than 2 and represents the number of blades $600_1$ to $600_n$ in the chassis 510A.

The blade $600_1$ includes a central processing unit (CPU) 610, memories 621, 622, 623, 624, and a communication large scale integrated circuit (LSI) 630. The CPU 610, the memories 621, 622, 623, 624, and the communication LSI 630 are connected together by a bus 650. The memories 621, 622, 623, 624 are, for example, a static random access memory (SRAM) as a main memory device.

Because the internal configurations of the blades $600_2$ to $600_n$ are the same as that of the blade $600_1$, their illustrations and descriptions are omitted.

The blades $600_1$ to $600_n$ are connected with press-fit connectors 60A (abbreviated by CN in FIG. 6), respectively. The press-fit connector 60A and the communication LSI 630 are connected together by a bus 660.

When the blades $600_1$ to $600_n$ are not particularly distinguished from one another, the blades are simply called "blades 600".

The board unit 100 is used as a back plane (BP), and includes press-fit connectors 150, 160. The press-fit connector 150 is an example of a first electronic component, and the press-fit connector 160 is an example of a second electronic component.

n press-fit connectors 150 are mounted on one side of the board unit 100, and n press-fit connectors 160 are mounted on the other side of the board unit 100.

Because the press-fit connectors 150, 160 are mounted on both sides of each board unit 100 as a BP, each board unit 100 is denoted by "BP" (Back Plane).

Each press-fit connector 150, 160 has a plurality of connection pins which are press-fitted in the through holes of the board unit 100 so that each connection pin is electrically connected to the conductive wall surface of the corresponding through hole. The structures of the board unit 100, and the connection parts of the press-fit connectors 150, 160 will be described later.

With the press-fit connectors 60A connected to the respective press-fit connectors 150, the blades $600_1$ to $600_n$ are electrically connected to wires or the like of the board unit 100, and are fastened to one side of the board unit 100 (left-hand side in FIG. 6).

Since the chassis 510B has the same structure as the chassis 510A, its description is omitted.

2n press-fit connectors 60B are mounted on the switch module 520. The press-fit connectors 160 of the board units 100 of the chassis 510A, 510B are connected to the press-fit connectors 60B of the switch module 520 via cables 88, respectively.

When the CPU 610 of one blade 600 in the chassis 510A communicates with the CPU 610 of another blade 600 in the same chassis 510A, the CPUs 610 exchange data with each other via the respective communication LSIs 630 and press-fit connectors 60A, 150, and the internal wires of the board unit 100.

When the CPU 610 of one blade 600 in the chassis 510A communicates with the CPU 610 of one blade 600 in the chassis 510B, the CPUs 610 exchange data with each other via the respective communication LSIs 630 and press-fit connectors 60A, 150, 160, 60B, the internal wires of the board unit 100, and the switch module 520. At this time, the switch module 520 connects the communication LSI 630 in the chassis 510A to the communication LSI 630 in the chassis 510B.

Figure 7:
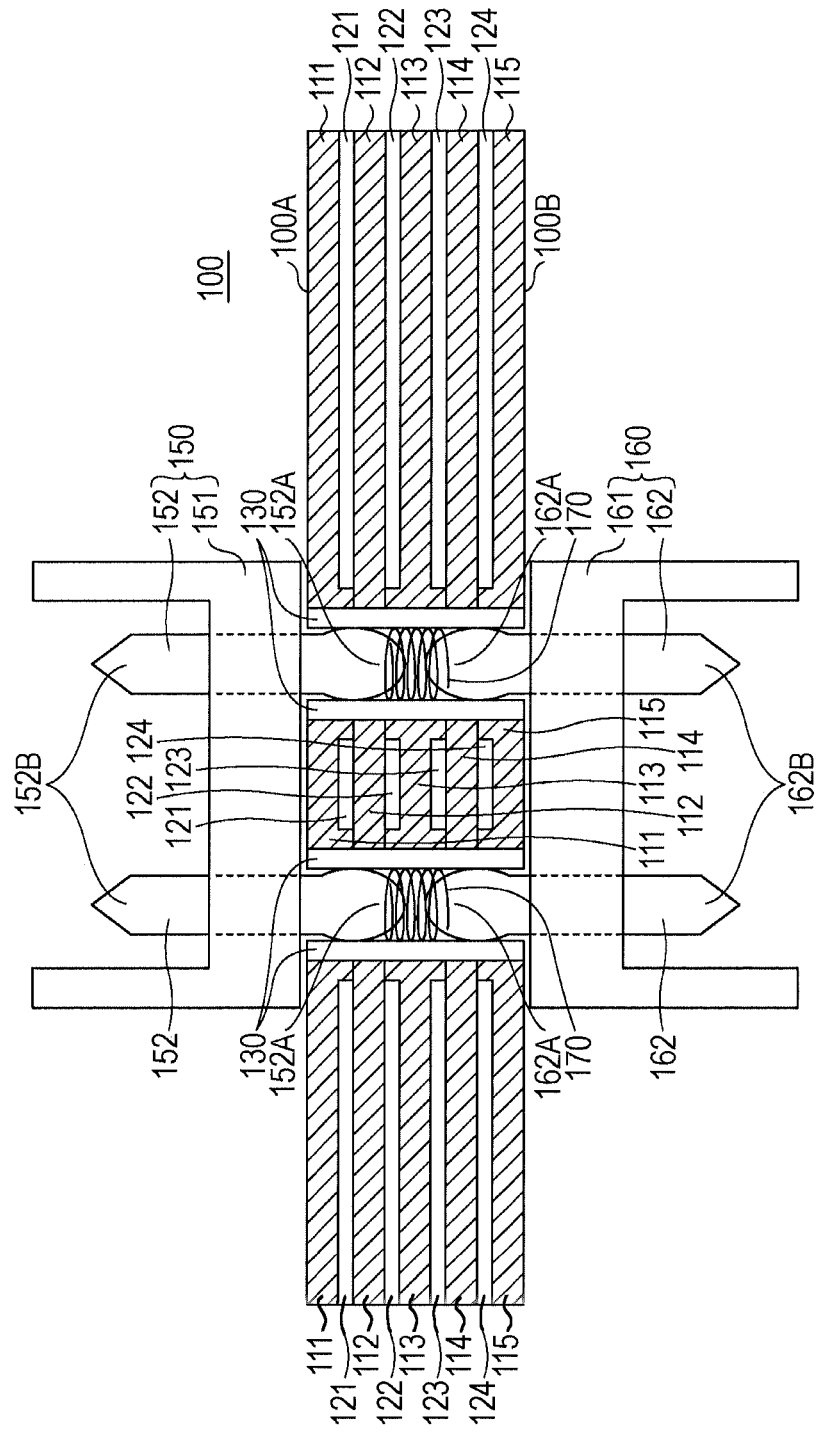
FIG. 7 is a diagram illustrating the cross-sectional structure of the board unit according to the first embodiment.

Next, the board unit 100 according to the first embodiment is described referring to FIG. 7.

FIG. 7 is a diagram illustrating the cross-sectional structure of the board unit 100 according to the first embodiment.

The board unit 100 includes five insulating layers 111, 112, 113, 114, 115, four conductive layers 121, 122, 123, 124, through holes 130, press-fit connectors 150, 160, and coil springs 170. The insulating layers 111, 112, 113, 114, 115, the conductive layers 121, 122, 123, 124, and the through hole 130 of the board unit 100 form a printed circuit board (board).

The through holes 130 penetrating the board unit 100 from a top surface 100A of the board unit 100 to a bottom surface 100B thereof are formed in the board unit 100.

The board unit 100 is formed of, for example, a glass cloth base of FR4 (Flame Retardant Type 4) or FR5 (Flame Retardant Type 5), and epoxy resin.

For example, the insulating layers 111, 113, 115 are prepreg layers having fibers impregnated with a thermoset resin, e.g., a glass cloth base impregnated with an epoxy resin. The insulating layers 12, 14 are core layers, for example. In case of prepreg layers, the insulating layers 12, 14 may be formed of an epoxy resin containing no fibers.

The conductive layers 121, 122, 123, 124 are formed of a copper foil, for example. The conductive layers 121, 122, 123, 124 are used as, for example, wiring layers for signal transfer, power supply layers, or ground layers or the like.

Because the conductive layers 121, 122, 123, 124 are not connected to the through holes 130, the conductive layers 121, 122, 123, 124 are patterned so as to avoid the through holes 130 as seen in a plan view.

The insulating layers 111, 112, 113, 114, 115, and the conductive layers 121, 122, 123, 124 are fixed by performing a heat-curing process with the conductive layers 121, 122, and the conductive layers 123, 124 respectively formed on both sides of the insulating layer 112 and the insulating layer 114 as core layers.

The board unit 100 is a four-layer board unit in which conductive layers are not formed on the top surface 100A and the bottom surface 100B. This is because in case of transferring fast signals with a transfer speed of several tens of Gbps (or higher), it is desirable that the insulating layers (111 to 115) are present on both sides of each of the conductive layers 121 to 124 in order to secure a good transfer characteristic.

However, the board unit 100 according to the first embodiment is not limited to the type which does not have conductive layers on the top surface 100A and the bottom surface 100B, but may have a 5-layer structure or a 6-layer structure with a conductive layer formed on one of the top surface 100A and the bottom surface 1006, or on both thereof.

Although FIG. 7 illustrates two through holes 130 and one set of press-fit connectors 150, 160 for the sake of descriptive convenience, the board unit 100 may include plural sets of press-fit connectors 150, 160 and through holes 130 whose quantity is set according to the quantity of the press-fit connectors 150, 160.

Further, the board unit 100 is not limited to the FR4 or FR5 type, but may of another grade according to the FR standard, or may be compliant with another standard as long as the board unit 100 includes inner conductive layers.

The through holes 130 are formed by first forming through holes penetrating the insulating layers 111 to 115 from the top surface 100A of the board unit 100 to the bottom surface 100B thereof, and then performing plating on the wall surfaces of the through holes. Accordingly, the walls of the through holes 130 become conductive walls.

The plating process to form the through holes 130 is carried out by, for example, forming an electroless plated layer on the wall surface of each through hole first, then forming an electrolytic plated layer on the electroless plated layer. Available examples of the electroless plated layers and electrolytic plated layers include a copper plated layer, a gold plated layer, a tin plated layer, or the like.

To perform the plating process, a plating resist or the like may be applied to a portion where a plated layer is not formed. Available examples of the plating resist include a fluorine resin, silicon resin and olefin resin to which electroless plating is not easily applied.

Each of the press-fit connectors 150, 160 includes a casing 151, 161, and a connection pin 152, 162.

An available material for the casings 151, 161 is, for example, a polyester resin.

An available material for the connection pins 152, 162 is, for example, phosphor bronze or a nickel alloy plated with gold. As indicated by dashed lines in FIG. 7, the connection pins 152, 162 respectively penetrate the casings 151, 161, and are held by the casings 151, 161.

Although FIG. 7 illustrates two connection pins 152, 162 for each of the press-fit connectors 150, 160 for the sake of descriptive convenience, the press-fit connector 150, 160 includes sixteen or thirty-two connection pins 152, 162, for example.

Tips 152A of the connection pins 152 of the press-fit connector 150 are press-fitted in the through holes 130 from the top surface 100A side of the board unit 100. Tips 162A of the connection pins 162 of the press-fit connector 160 are press-fitted in the through holes 130 from the bottom surface 100B side of the board unit 100.

Terminals 152B of the connection pins 152 are connected to the press-fit connector 60A of the blade 600, and terminals 162B of the connection pins 162 are connected to the cable 88 (see FIG. 6).

Each coil spring 170 is inserted into space between the tip 152A of the connection pin 152 and the tip 162A of the connection pin 162 inside the through hole 130.

Space is provided between the tip 152A of the connection pin 152 and the tip 162A of the connection pin 162 because if the tips 152A, 162A contact each other when the connection pin 152 and the connection pin 162 are press-fitted, force to push back the connection pin 152 or the connection pin 162 is applied thereto, which may result in improper connection to the through hole 130.

Because the coil spring 170 is used to connect the tip 152A of the connection pin 152 to the tip 162A of the connection pin 162, it is preferable that the tips 152A, 162A are inserted in such a way that the axial direction (compressing and stretching direction) substantially matches with the axial direction of the through hole 130 as illustrated in FIG. 7.

The entire length and the spring constant of the coil springs 170 may be set so that when the pins 152, 162 are inserted in the through holes 130, each coil spring 170 is compressed more than the natural length between the tip 152A and the tip 162A and can demonstrate sufficient restoring force.

The coil spring 170 is an example of a conductive elastic member, as well as an example of a conductive member. Although the coil spring 170 has only to be formed of a conductive material, the coil spring 170 is preferably formed of the same material as that of the plated layer on the through hole 130. Therefore, the coil spring 170 is formed of, for example, copper, gold, tin or the like.

Next, referring to FIGS. 8A to 8D, and FIGS. 9A and 9B, a method of fabricating the board unit 100 according to the first embodiment is described.

FIGS. 8A to 8D, 9A and 9B are cross-sectional views illustrating the fabrication method for the board unit 100 (101) according to the first embodiment. FIGS. 8A to 8D, 9A and 9B illustrate the board unit 100 (101) in a smaller size than FIG. 7. The board unit 101 represents a board unit in a fabrication stage before the board unit 100 is completed.

Figure 8A:
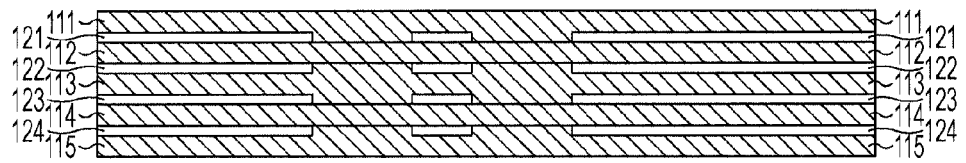
FIGS. 8A to 8D are cross-sectional views illustrating a fabrication method for the board unit according to the first embodiment.

First, as illustrated in FIG. 8A, the insulating layers 111, 112, 113, 114, 115 and the conductive layers 121, 122, 123, 124 are laminated to be subjected to a heat-curing process, thereby fabricating the board unit 101. The conductive layers 121 to 124 of the board unit 101 illustrated in FIG. 8A are patterned so as to avoid the portions where the through holes 130 are to be formed later.

Figure 8B:
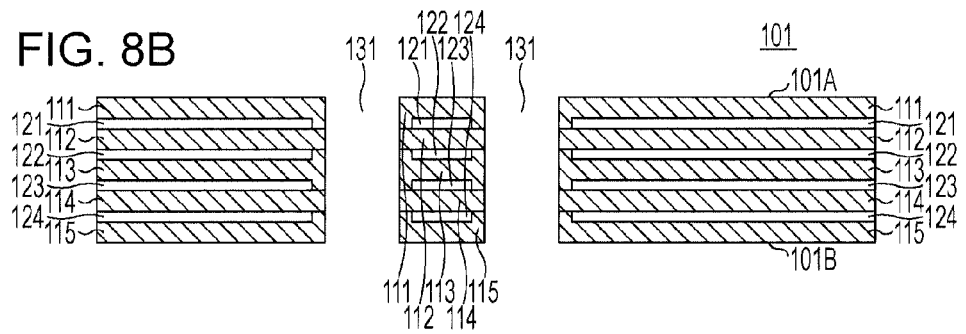

Next, as illustrated in FIG. 8B, through holes 131 are formed by performing drill-using machining, laser machining or the like from a top surface 101A of the board unit 101. The through holes 131 are formed by removing the insulating layers 111 to 115 from the top surface 101A of the board unit 101 to a bottom surface 101B thereof. The formation of the through holes 131 may be performed from the bottom surface 101B side of the board unit 101.

Figure 8C:
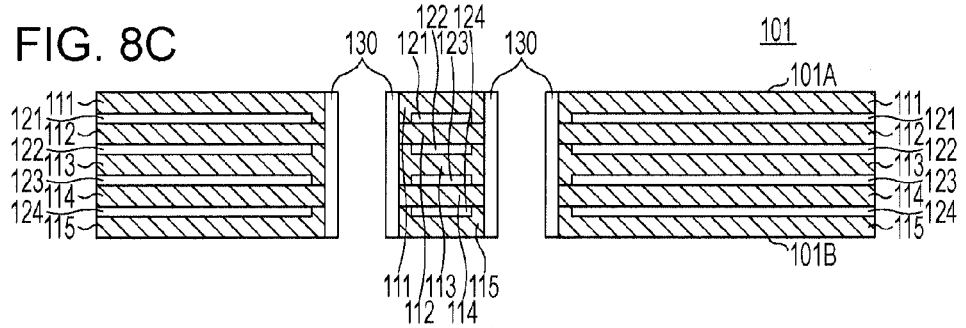

Next, the board unit 101 is soaked into an electroless plating solution to form an electroless plated layer, and an electrolytic plated layer is formed on the electroless plated layer, thereby forming the through holes 130 as illustrated in FIG. 8C.

According to the first embodiment, no plated layers are formed, except for the plated layers as the through holes 130, so that a plating resist may be applied to the entire outer surface of the board unit 101, for example, in the stage where the board unit 101 illustrated in FIG. 8A is fabricated.

If the through holes 131 are formed as illustrated in FIG. 8B after the plating resist is formed on the entire outer surface of the board unit 101 in the stage illustrated in FIG. 8A, the plating resist is not formed on the wall surfaces of the through holes 131. Accordingly, the through holes 130 as plated layers can be formed only on the wall surfaces of the through holes 131 by soaking the board unit 101 in an electroless plating solution.

Figure 8D:
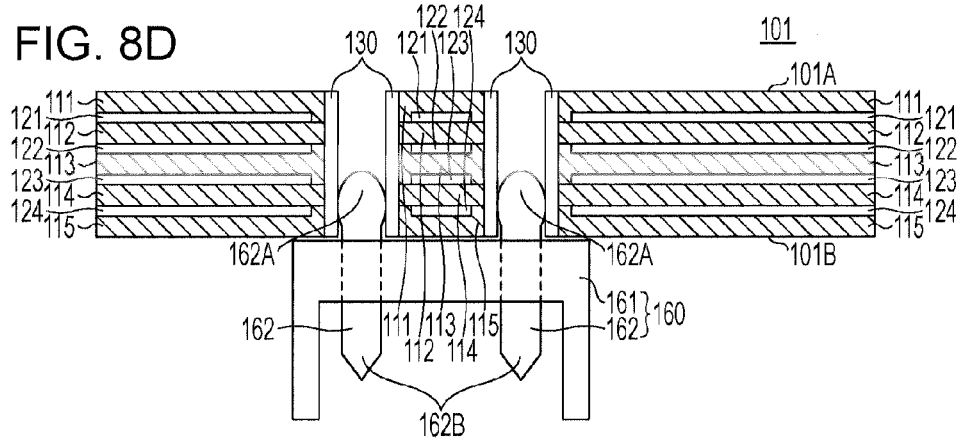

Next, as illustrated in FIG. 8D, the tips 162A of the connection pins 162 of the press-fit connector 160 are press-fitted in the through holes 130 from the bottom surface 101B side of the board unit 101. As a result, the press-fit connector 160 is fastened to the bottom surface 101B of the board unit 101.

Figure 9A:
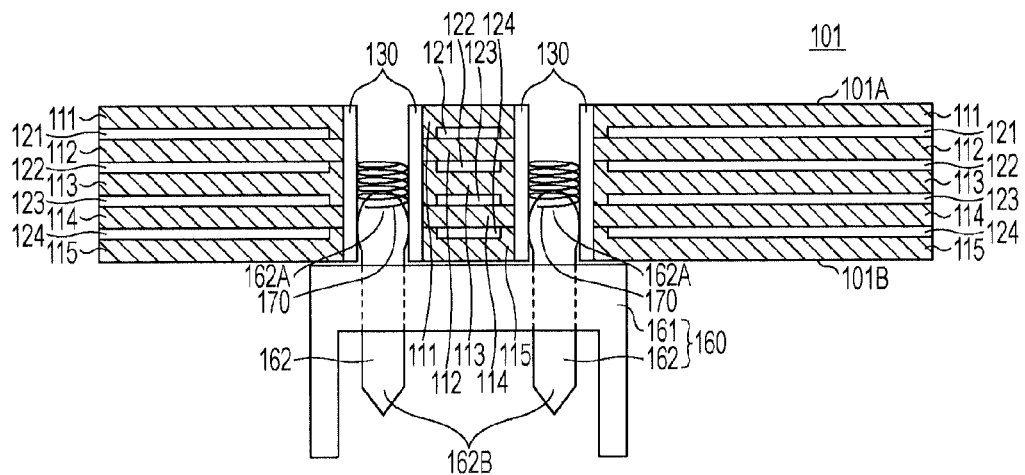
FIGS. 9A and 9B are cross-sectional views illustrating the fabrication method for the board unit according to the first embodiment.

Next, as illustrated in FIG. 9A, the coil springs 170 are inserted into the through holes 130 from the top surface 101A of the board unit 101. It is preferable at this time that the axial direction (compressing and stretching direction) of each coil spring 170 substantially matches with the axial direction of the through hole 130.

Figure 9B:
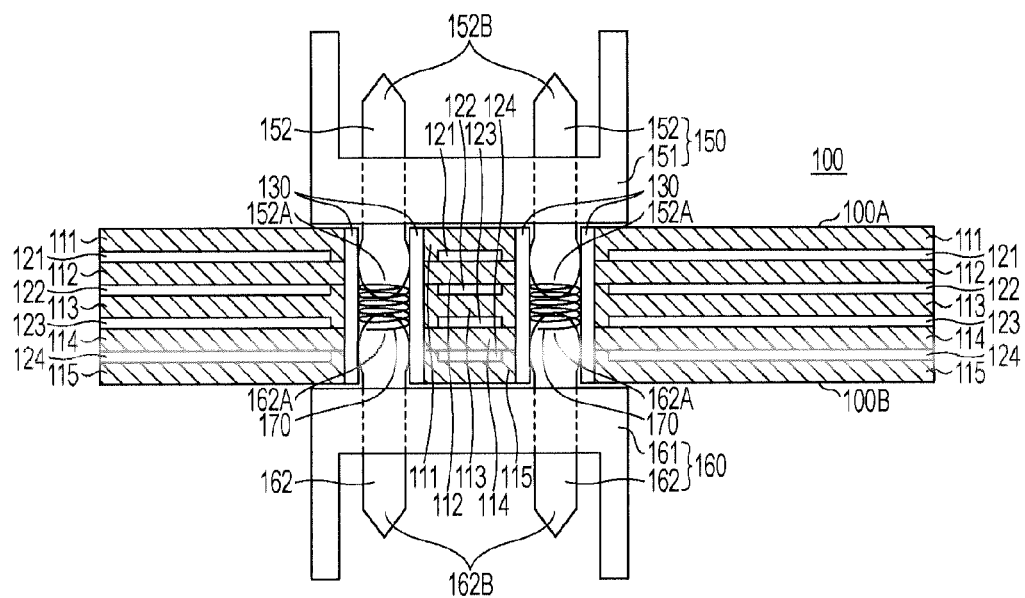

Finally, the tips 152A of the connection pins 152 of the press-fit connector 150 are press-fitted in the through holes 130 from the top surface 101A side of the board unit 101, thus completing the board unit 100 illustrated in FIG. 9B.

The board unit 100 illustrated in FIG. 9B is fabricated through the foregoing processing. The board unit 100 illustrated in FIG. 9B is the same as the board unit 100 illustrated in FIG. 7.

Because the board unit 100, unlike the conventional board unit, has the tips 152A, 162A of the connection pins 152, 162 connected together by the conductive coil springs 170, conductive portions which are not terminated become shorter, thus reducing the formation of stubs at the tips 152A, 162A of the connection pins 152, 162.

Particularly, it is possible to hardly produce stubs by optimizing the shapes of the tips 152A, 162A of the connection pins 152, 162 and the shape of the coil spring 170.

According to the first embodiment, therefore, effectively suppressing the production of stubs can restrain reflection of signals or generation of noise, thereby providing the board unit 100 which has a good fast signal transfer characteristic. In addition, the restraining of signal reflection or noise generation can ensure signal transfer over a long distance.

Further, the first embodiment need not use a build-up board, nor need machining like back drilling.

It is therefore possible to provide the low-cost, easy-to-fabricate board unit 100.

Second Embodiment

A board unit 200 according to a second embodiment differs from the board unit 100 according to the first embodiment in that a conductive elastic pad 270 is used in place of the coil spring 170. Because the other structures are the same as those of the board unit 100 according to the first embodiment, like or same reference numerals are given to like or same components to avoid the redundant description.

FIG. 10 is a diagram illustrating the cross-sectional structure of the board unit 200 according to the second embodiment.

The board unit 200 includes five insulating layers 111, 112, 113, 114, 115, four conductive layers 121, 122, 123, 124, through holes 130, press-fit connectors 150, 160, and conductive elastic pads 270. The insulating layers 111, 112, 113, 114, 115, the conductive layers 121, 122, 123, 124, and the through hole 130 of the board unit 200 form a printed circuit board (board).

As mentioned above, the conductive elastic pad 270 is used in place of the coil spring 170 according to the first embodiment, and is an example of a conductive elastic pad, as well as an example of a conductive member. Silicon rubber containing conductive particles, a conductive sponge, or an isotropic conductive sheet having thin metal wires embedded therein in the thicknesswise direction of a silicon rubber sheet is available as the conductive elastic pad 270.

It is preferable that the conductive material contained in the conductive elastic pad 270 is the same material as that of the plated layer of the through hole 130. It is therefore desirable that the conductive elastic pad 270 contains, for example, copper, gold or tin as the conductive material.

Figure 11A:
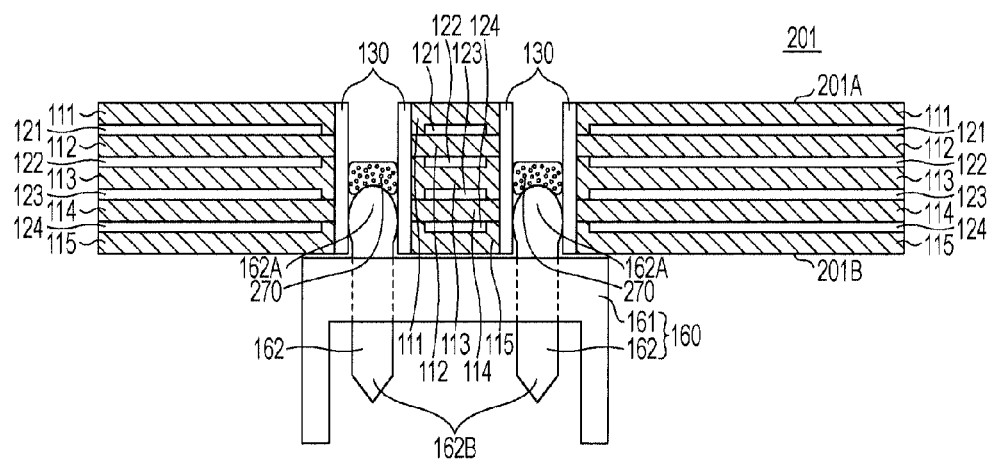
FIGS. 11A and 11B are cross-sectional views illustrating a fabrication method for the board unit according to the second embodiment.
Figure 11B:
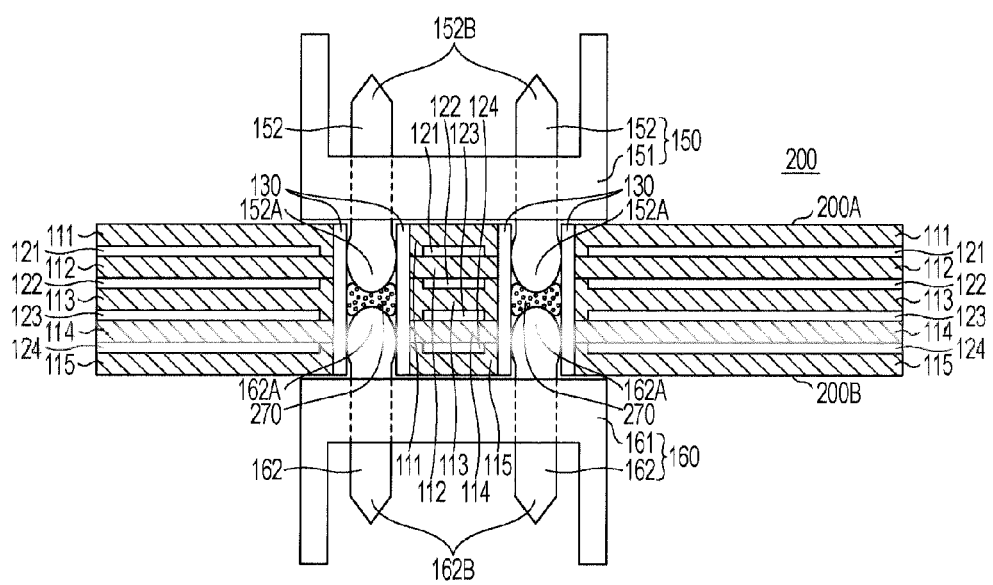

Next, referring to FIGS. 11A and 11B, a method of fabricating the board unit 200 according to the second embodiment is described.

FIGS. 11A and 11B are cross-sectional views illustrating the fabrication method for the board unit 200 (201) according to the second embodiment. FIGS. 11A and 11B illustrate the board unit 200 (201) in a smaller size than FIG. 10. The board unit 201 represents a board unit in a fabrication stage before the board unit 200 is completed.

The fabrication process for the board unit 200 is the same as the fabrication process for the board unit 100 according to the first embodiment until the processes of forming the through holes 131 and the through holes 130, and mounting the press-fit connector 160 after laminating the insulating layers 111 to 115 and the conductive layers 121 to 124 to fabricate the board unit 201.

Therefore, by reference to FIGS. 8A to 8D illustrating the processes up to the mounting of the press-fit connector 160, the description of the process is omitted.

After the tips 162A of the connection pins 162 of the press-fit connector 160 are press-fitted in the through holes 130 from a bottom surface 201B side of the board unit 201 to fasten the press-fit connector 160 to the bottom surface 201B of the board unit 201, a process illustrated in FIG. 11A is carried out.

In the process illustrated in FIG. 11A, the conductive elastic pads 270 are inserted into the through holes 130 from a top surface 201A of the board unit 201.

Finally, the tips 152A of the connection pins 152 of the press-fit connector 150 are press-fitted in the through holes 130 from the top surface 201A side of the board unit 201, thus completing the board unit 200 illustrated in FIG. 11B.

The board unit 200 illustrated in FIG. 11B is fabricated through the foregoing processing. The board unit 200 illustrated in FIG. 11B is the same as the board unit 200 illustrated in FIG. 10.

Because the board unit 200, unlike the conventional board unit, has the tips 152A, 162A of the connection pins 152, 162 connected together by the conductive elastic pads 270, conductive portions which are not terminated become shorter, thus reducing the formation of stubs at the tips 152A, 162A of the connection pins 152, 162.

Particularly, it is possible to hardly produce stubs by accurately placing the conductive elastic pads 270 between the tips 152A, 162A of the connection pins 152, 162.

According to the second embodiment, therefore, effectively suppressing the production of stubs can restrain reflection of signals or generation of noise, thereby providing the board unit 200 which has a good fast signal transfer characteristic. In addition, the restraining of signal reflection or noise generation can ensure signal transfer over a long distance.

Further, the second embodiment need not use a build-up board, nor need machining like back drilling.

It is therefore possible to provide the low-cost, easy-to-fabricate board unit 200.

Third Embodiment

A board unit 300 according to a third embodiment differs from the board unit 100 according to the first embodiment in that press-fit connectors 350, 360 are used in place of the press-fit connectors 150, 160, and the coil spring 170 is not used.

Because the other structures are the same as those of the board unit 100 according to the first embodiment, like or same reference numerals are given to like or same components to avoid the redundant description.

Figure 12:
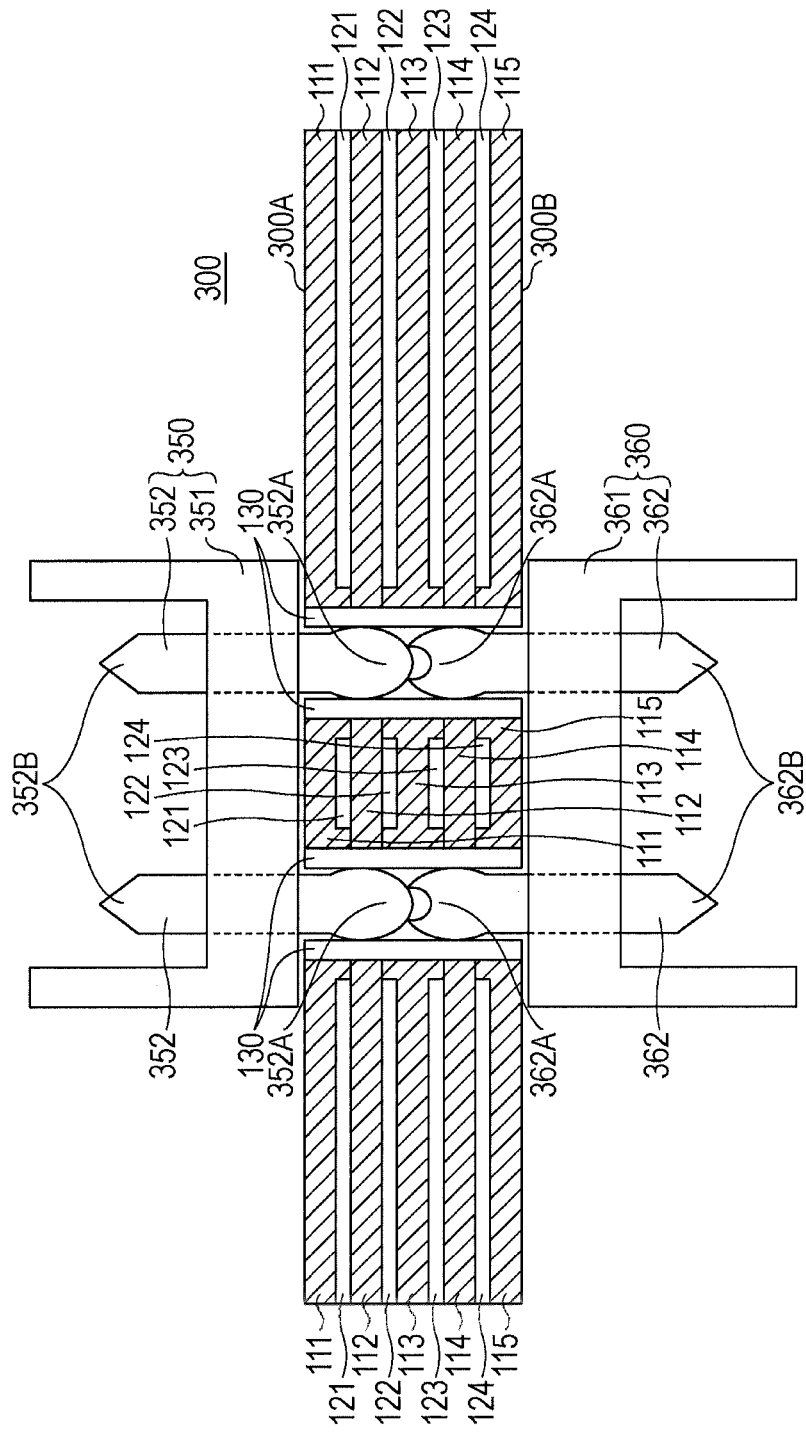
FIG. 12 is a diagram illustrating the cross-sectional structure of a board unit according to a third embodiment.

FIG. 12 is a diagram illustrating the cross-sectional structure of the board unit 300 according to the third embodiment.

The board unit 300 includes five insulating layers 111, 112, 113, 114, 115, four conductive layers 121, 122, 123, 124, through holes 130, and press-fit connectors 350, 360. The insulating layers 111, 112, 113, 114, 115, the conductive layers 121, 122, 123, 124, and the through holes 130 of the board unit 300 form a printed circuit board (board).

The press-fit connectors 350, 360 respectively include casings 351, 361, and connection pins 352, 362. The press-fit connector 350 is an example of a first electronic component, and the press-fit connector 360 is an example of a second electronic component.

The connection pin 352 has a tip 352A with a projecting shape, and the connection pin 362 has a tip 362A with a recessed shape. The sizes of the connection pins 352, 362, the projecting shape of the tip 352A and the recessed shape of the tip 362A are set so that when the connection pins 352, 362 are press-fitted in the through holes 130, the projection of the tip 352A and the recess of the tip 362A contact each other or are crimped together.

Specifically, the length of the connection pin 162 of the press-fit connector 160 according to the first embodiment is made longer to contact the connection pin 152, and a recess is formed in the tip of the connection pin 162 to achieve the press-fit connectors 350, 360.

At this time, the recessed portion of the tip 362A may be smashed to be firmly adhered to the projecting portion of the tip 352A.

A polyester resin, for example, may be used as the material for the casings 351, 361.

Phosphor bronze or a nickel alloy plated with gold, for example, may be used as the material for the connection pins 352, 362.

It is desirable that the press-fit connector 350 and the press-fit connector 360 are mounted on the board unit 300 at the same time. As indicated by dashed lines in FIG. 12, the connection pins 352, 362 respectively penetrate the casings 351, 361, and are held by the casings 351, 361.

The press-fit connectors 350, 360 are mounted on the board unit 300 by press-fitting both the tips 352A, 362A of the press-fit connectors 350, 360 into the through holes 130, and pressing both tips 352A, 362A to crimp the projecting shape and the recessed shape of the tips 352A, 362A.

Figure 13A:
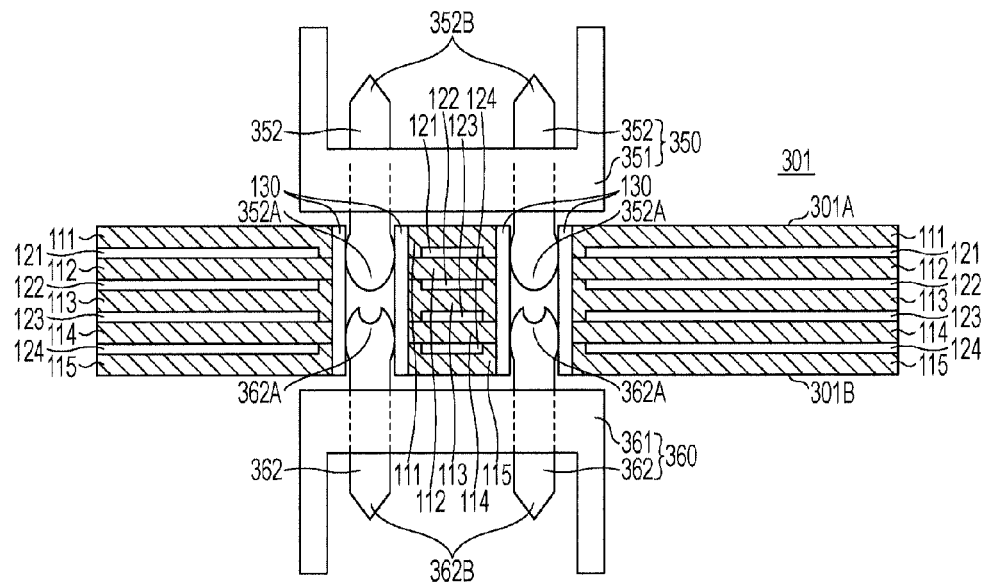
FIGS. 13A and 13B are cross-sectional views illustrating a fabrication method for the board unit according to the third embodiment.
Figure 13B:
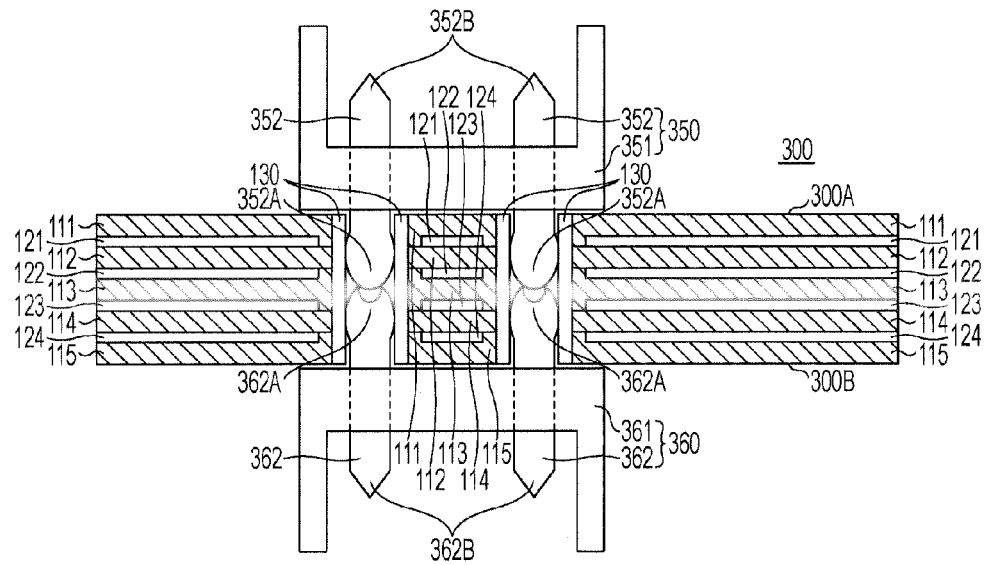

Next, referring to FIGS. 13A and 13B, a method of fabricating the board unit 300 according to the third embodiment is described.

FIGS. 13A and 13B are cross-sectional views illustrating the fabrication method for the board unit 300 (301) according to the third embodiment. FIGS. 13A and 13B illustrate the board unit 300 (301) in a smaller size than FIG. 12. The board unit 301 represents a board unit in a fabrication stage before the board unit 300 is completed.

The fabrication process for the board unit 300 is the same as the fabrication process for the board unit 100 according to the first embodiment until the processes of forming the through holes 131 and the through holes 130 after laminating the insulating layers 111 to 115 and the conductive layers 121 to 124 to fabricate the board unit 301.

Therefore, by reference to FIGS. 8A to 8C illustrating the processes up to the formation of the through holes 130, the description of the process is omitted.

As illustrated in FIG. 13A, the tips 352A of the connection pins 352 of the press-fit connector 350 are press-fitted in the through holes 130 from the top surface 301A side of the board unit 301 in which the through holes 130 are formed. At the same time, the tips 362A of the connection pins 362 of the press-fit connector 360 are press-fitted in the through holes 130 from the bottom surface 301B side of the board unit 300.

Next, the connection pins 352, 362 of the press-fit connectors 350, 360 are press-fitted in the through holes 130 in such a way that the projecting portion and the recessed portion of the tips 352A, 362A of the connection pins 352, 362 are pressed and crimped. This completes the board unit 300 illustrated in FIG. 13B.

The board unit 300 illustrated in FIG. 13B is fabricated through the foregoing processing. The board unit 300 illustrated in FIG. 13B is the same as the board unit 300 illustrated in FIG. 12.

Because the board unit 300, unlike the conventional board unit, has the tips 352A, 362A of the connection pins 352, 362 crimped together, conductive portions which are not terminated become shorter, thus reducing the formation of stubs at the tips 352A, 362A of the connection pins 352, 362.

Particularly, it is possible to hardly produce stubs by smashing the recessed portion of the tip 362A to be crimped with the projecting portion of the tip 352A.

According to the third embodiment, therefore, effectively suppressing the production of stubs can restrain reflection of signals or generation of noise, thereby providing the board unit 300 which has a good fast signal transfer characteristic. In addition, the restraining of signal reflection or noise generation can ensure signal transfer over a long distance.

Further, the third embodiment need not use a build-up board, nor need machining like back drilling.

It is therefore possible to provide the low-cost, easy-to-fabricate board unit 300.

Fourth Embodiment

A board unit 400 according to a fourth embodiment differs from the board unit 100 according to the first embodiment in that a press-fit connector 450 is mounted only one side of a board unit 400 and a conductive resin is injected between a tip 452A of a connection pin 452 of the press-fit connector 450 and the wall surface of the through hole 130.

Because the other structures are the same as those of the board unit 100 according to the first embodiment, like or same reference numerals are given to like or same components to avoid the redundant description.

Figure 14:
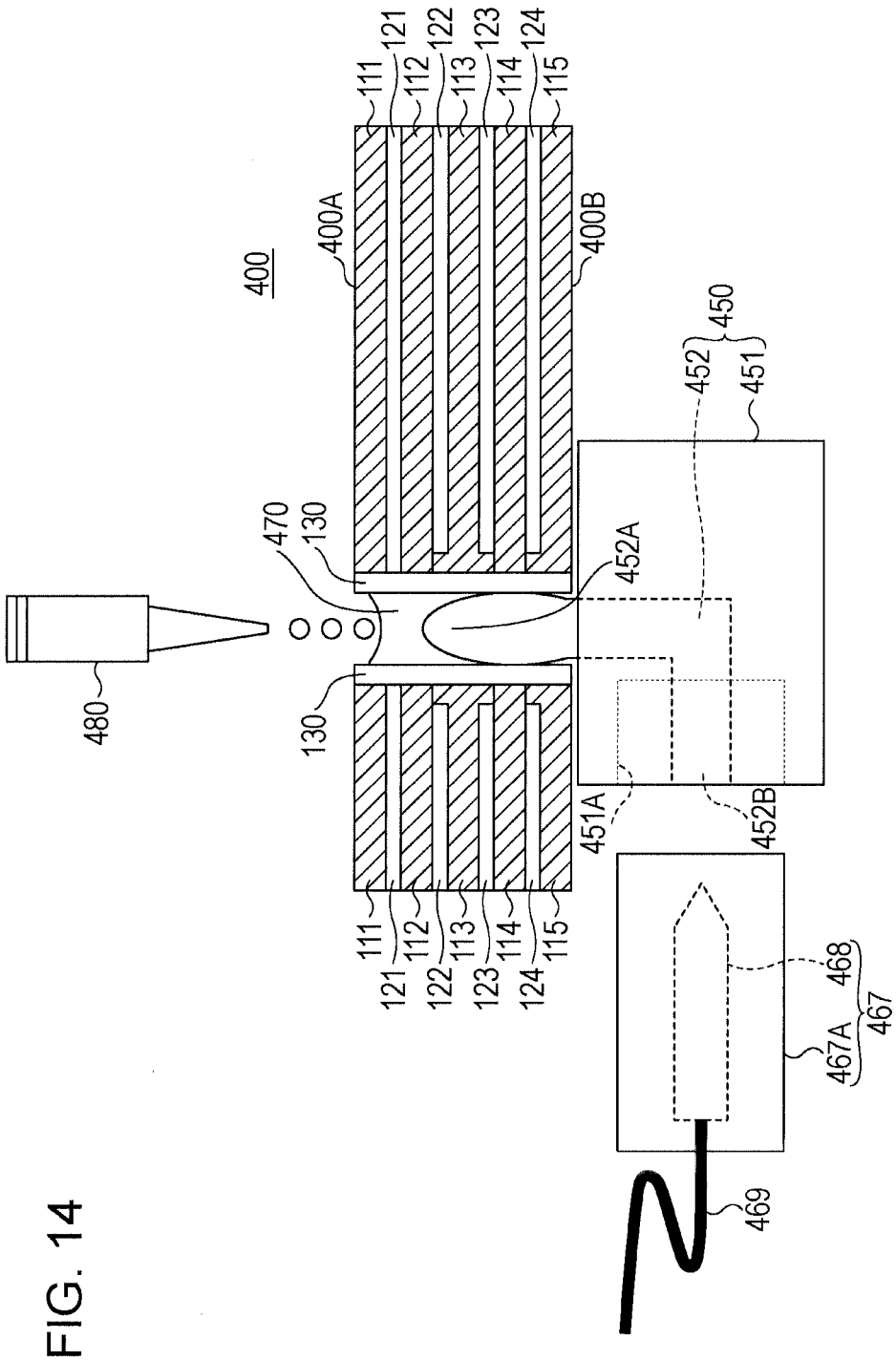
FIG. 14 is a diagram illustrating the cross-sectional structure of a board unit according to a fourth embodiment.

FIG. 14 is a diagram illustrating the cross-sectional structure of the board unit 400 according to the fourth embodiment.

The board unit 400 includes five insulating layers 111, 112, 113, 114, 115, four conductive layers 121, 122, 123, 124, a through hole 130, and a press-fit connector 450. The insulating layers 111, 112, 113, 114, 115, the conductive layers 121, 122, 123, 124, and the through hole 130 of the board unit 400 form a printed circuit board (board).

According to the fourth embodiment, the through hole 130 is connected to the conductive layer 121, but not to the conductive layers 122 to 124.

The press-fit connector 450 includes a casing 451 and a connection pin 452. The press-fit connector 450 is an example of a first electronic component.

The size of the connection pin 452 is set so that when the connection pin 452 is press-fitted in the through hole 130, the tip 452A is fitted inside the through hole 130.

A polyester resin, for example, may be used as the material for the casing 451.

Phosphor bronze or a nickel alloy plated with gold, for example, may be used as the material for the connection pin 452. As indicated by dashed lines in FIG. 14, the connection pin 452 penetrates the casing 451 in an L shape, and is held by the casing 451.

The press-fit connector 450 is mounted on the board unit 400 by press-fitting the tip 452A of the press-fit connector 450 into the through hole 130 from the bottom surface 400B side of the board unit 400.

After the tip 452A of the connection pin 452 is press-fitted in the through hole 130, a conductive resin 470 is injected into the through hole 130 from a top surface 400A of the board unit 400 so that the conductive resin 470 fills the space defined by the tip 452A and the wall surface of the through hole 130.

A conductive adhesive containing, as a conductive filler, gold power, copper powder, nickel powder, silver powder, aluminum powder, plating powder, carbon powder, graphite powder or the like may be used as the conductive resin 470.

The conductive resin 470 has only to be injected into the through hole 130 in alignment with the through hole 130 with a syringe (injector) 480 mounted, instead of a drill, on an apparatus that forms a through hole for forming the through hole 130 in the board unit 400 with the drill.

A female connector portion 452B of the connection pin 452 of the press-fit connector 450 is provided at a recess 451A of the casing 451 of the press-fit connector 450, and is connected with a cable connector 467.

The cable connector 467 includes a casing 467A and a male connector portion 468 which is held inside the casing 467A. The connector portion 468 of the cable connector 467 is fitted in the connector portion 452B of the press-fit connector 450. At this time, part of the casing 467A of the cable connector 467 is press-fitted in the recess 451A of the casing 451 of the press-fit connector 450. A cable 469 is connected to the connector portion 468 of the cable connector 467.

The connection pin 452 of the press-fit connector 450 is press-fitted in the through hole 130 from the bottom surface 400B side of the board unit 400. The through hole 130 is connected to the conductive layer 121 located closest to the top surface 400A among the four conductive layers 121 to 124.

This is because portions which are not terminated are reduced if the through hole 130 is connected to the conductive layer 121 located farthest (on the top surface 400A side) from the side where the connection pin 452 is inserted (on the bottom surface 400B side), rather than it is connected to any one of the conductive layers 122, 123 and 124.

Therefore, when the connection pin 452 of the press-fit connector 450 is press-fitted in the through hole 130 from the top surface 400A side of the board unit 400, for example, it is desirable to connect the through hole 130 to the conductive layer 124 (located closest to the bottom surface 400B).

The foregoing approach reduces non-terminated portions and can thus suppress production of stubs, thus improving the signal transfer characteristic.

Figure 15A:
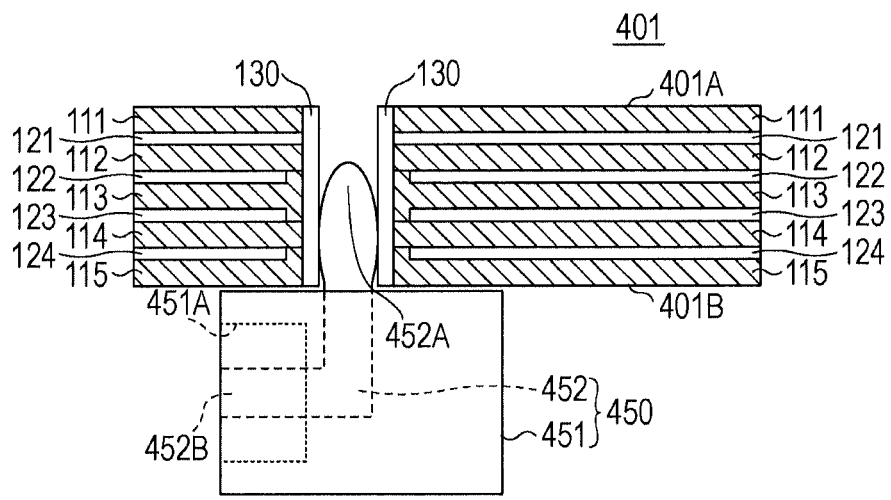
FIGS. 15A and 15B are cross-sectional views illustrating a fabrication method for the board unit according to the fourth embodiment.
Figure 15B:
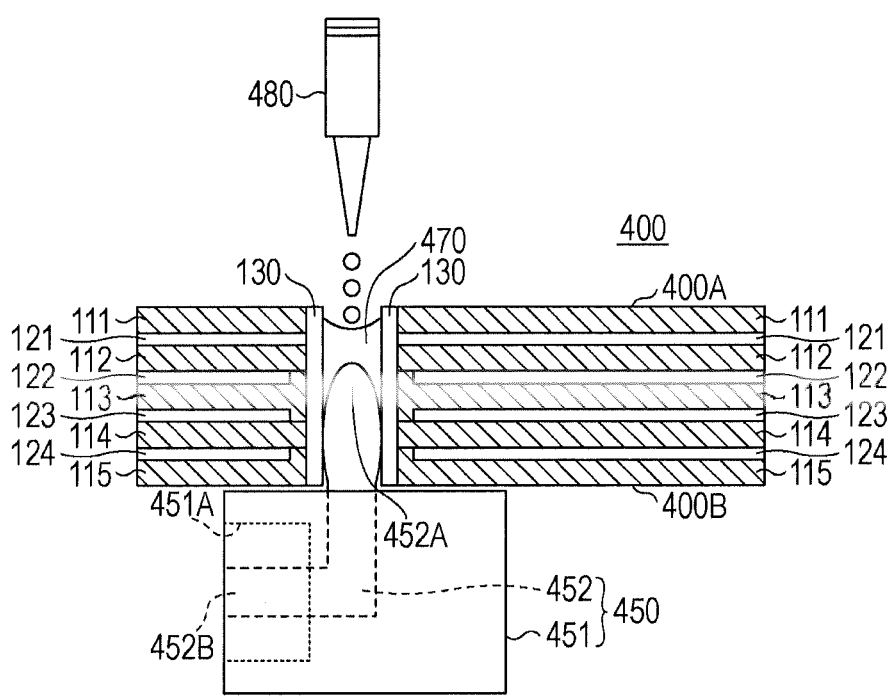

Next, referring to FIGS. 15A and 15B, a method of fabricating the board unit 400 according to the fourth embodiment is described.

FIGS. 15A and 15B are cross-sectional views illustrating the fabrication method for the board unit 400 (401) according to the fourth embodiment. FIGS. 15A and 15B illustrate the board unit 400 (401) in a smaller size than FIG. 14. The board unit 401 represents a board unit in a fabrication stage before the board unit 400 is completed.

The fabrication process for the board unit 400 is the same as the fabrication process for the board unit 100 according to the first embodiment until the processes of forming the through hole 131 and the through hole 130 after laminating the insulating layers 111 to 115 and the conductive layers 121 to 124 to fabricate the board unit 401.

Therefore, by reference to FIGS. 8A to 8C illustrating the processes up to the formation of the through hole 130, the description of the process is omitted.

As illustrated in FIG. 15A, the tip 452A of the connection pin 452 of the press-fit connector 450 is press-fitted in the through hole 130 from the bottom surface 401B side of the board unit 401 in which the through hole 130 is formed.

Next, the conductive resin 470 is injected from the top surface 400A side of the board unit 400. The conductive resin 470 fills the space that is defined by the tip 452A and the wall surface of the through hole 130. This completes the board unit 400 illustrated in FIG. 15B.

The board unit 400 illustrated in FIG. 15B is fabricated through the foregoing processing. The board unit 400 illustrated in FIG. 15B is the same as the board unit 400 illustrated in FIG. 14.

Because the board unit 400, unlike the conventional board unit, has the conductive resin 470 filling the space that is defined by the tip 452A of the connection pin 452 and the wall surface of the through hole 130, conductive portions which are not terminated become shorter, thus reducing the formation of stubs at the tip 452A of the connection pin 452.

According to the fourth embodiment, therefore, effectively suppressing the production of stubs can restrain reflection of signals or generation of noise, thereby providing the board unit 400 which has a good fast signal transfer characteristic. In addition, the restraining of signal reflection or noise generation can ensure signal transfer over a long distance.

Further, the fourth embodiment need not use a build-up board, nor need machining like back drilling.

It is therefore possible to provide the low-cost, easy-to-fabricate board unit 400.

Although the press-fit connector 450 is mounted only on the bottom surface 400B of the board unit 400 according to the fourth embodiment, a press-fit connector may be mounted on the top surface 400A of the board unit 400. In this case, the conductive resin 470 might not fully fill the through hole 130, but the press-fit connector may be mounted on the top surface 400A of the board unit 400 after an adequate amount of the conductive resin 470 is injected into the through hole 130 in consideration of the connection pin of the press-fit connector on the top surface 400A side is press-fitted in the through hole 130.

The foregoing descriptions of the first to fourth embodiments have been given of an example where the board unit 100, 200, 300, 400 is included in the server 500 as an electronic apparatus. However, an electronic apparatus including the board unit 100, 200, 300, 400 is not limited to the server 500, and may be a personal computer (PC), a cellular-phone terminal, a smart phone, a digital camera, a video camera or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A board unit comprising:
  a board that has a through hole penetrating the board from a first side of the board to a second side of the board and having a conductive inner wall surface;
  a first electronic component that has a first connection pin to be press-fitted in the through hole from the first side of the board;
  a conductive member that is disposed in the through hole to connect the inner wall surface of the through hole to the first connection pin; and
  a second electronic component that has a second connection pin to be press-fitted in the through hole from the second side of the board, the conductive member being disposed in the through hole so as to connect the first connection pin to the second connection pin.

2. The board unit according to claim 1, wherein the conductive member is a conductive resin filled partially in the through hole.

3. The board unit according to claim 1, wherein the conductive member is a conductive elastic member disposed in the through hole such that the through hole is only partially filled with the conductive elastic member.

4. The board unit according to claim 3, wherein the conductive elastic member is a conductive spring.

5. The board unit according to claim 3, wherein the conductive elastic member is a conductive elastic pad.

6. A board unit comprising:
  a board that has a through hole penetrating the board from a first side of the board to a second side of the board and having a conductive inner wall surface;
  a first electronic component that is mounted on the first side of the board and has a projecting connection pin to be press-fitted in the through hole from the first side of the board; and
  a second electronic component that is mounted on the second side of the board and has a recessed connection pin to be press-fitted in the through hole from the second side of the board so as to contact the projecting connection pin.

7. The board unit according to claim 6, wherein at least one of the projecting connection pin and the recessed connection pin press-fitted in the through hole is squashed.

8. A fabricating method of a board unit in which a through hole penetrating the board unit from a first side of the board and a second side of the board thereof is formed, and on which a component is to be mounted, the fabricating method comprising:
  press-fitting a first connection pin of a first electronic component in the through hole from the first side of the board;
  disposing a conductive member in the through hole to connect a conductive inner wall surface of the through hole to the first connection pin;
  press-fitting a second connection pin of a second electronic component in the through hole from the second side of the board, the conductive member being disposed in the through hole so as to connect the first connection pin to the second connection pin.

* * * * *